(12) United States Patent
Freidhoff et al.

(10) Patent No.: US 7,786,653 B2
(45) Date of Patent: Aug. 31, 2010

(54) MEMS PIEZOELECTRIC SWITCH

(75) Inventors: Carl B. Freidhoff, New Freedom, PA (US); Silai V. Krishnaswamy, Monroeville, PA (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 358 days.

(21) Appl. No.: 11/773,046

(22) Filed: Jul. 3, 2007

(65) Prior Publication Data
US 2009/0009030 A1    Jan. 8, 2009

(51) Int. Cl.
*H01L 41/047* (2006.01)
(52) U.S. Cl. .................. 310/328; 310/330; 310/365
(58) Field of Classification Search ............. 310/314, 310/328, 330–332, 365, 366; 200/181
See application file for complete search history.

(56) References Cited

U.S. PATENT DOCUMENTS

| 5,255,016 A * | 10/1993 | Usui et al. ............... 347/71 |
| 5,315,204 A | 5/1994 | Park |
| 5,592,042 A * | 1/1997 | Takuchi et al. ............ 310/328 |
| 5,627,396 A | 5/1997 | James et al. |
| 5,852,337 A | 12/1998 | Takeuchi et al. |
| 5,861,702 A | 1/1999 | Bishop et al. |
| 6,091,182 A | 7/2000 | Takeuchi et al. |
| 6,265,811 B1 | 7/2001 | Takeuchi et al. |
| 6,323,580 B1 | 11/2001 | Bernstein |
| 6,359,374 B1 | 3/2002 | Dausch et al. |
| 6,584,660 B1 | 7/2003 | Shimogawa et al. |
| 2001/0022487 A1 * | 9/2001 | Takeuchi et al. ............ 310/330 |
| 2003/0173196 A1 | 9/2003 | Belanger, Jr. et al. |
| 2004/0075366 A1 | 4/2004 | Mehta |
| 2004/0130243 A1 | 7/2004 | Buhler et al. |
| 2005/0236935 A1 | 10/2005 | Ohmori et al. |
| 2005/0242687 A1 | 11/2005 | Kawakubo et al. |
| 2006/0119227 A1 * | 6/2006 | Ikehashi ................ 310/348 |

\* cited by examiner

*Primary Examiner*—Walter Benson
*Assistant Examiner*—Derek J Rosenau
(74) *Attorney, Agent, or Firm*—Rothwell, Figg, Ernst & Manbeck, P.C.

(57) ABSTRACT

The present invention provides a MEMS piezoelectric switch that has an articulated unimorph bridge attached to a substrate. The bridge includes a passive layer of zirconia and at least one silicon-based material, an active layer of a piezoelectric material that has a high piezoelectric coefficient, at least one pair of interdigitated electrodes, disposed on the top surface of the active layer and across which the bias voltage is applied, and a top contact electrode. A bottom contact electrode is provided on the substrate, and signals flow through the switch when the top and bottom contact electrodes contact one another.

7 Claims, 3 Drawing Sheets

US 7,786,653 B2

MEMS PIEZOELECTRIC SWITCH

FIELD OF THE INVENTION

The present invention relates to microelectromechanical systems (MEMS) switches. More particularly, the present invention relates to MEMS piezoelectric switches.

BACKGROUND OF THE INVENTION

Semiconductor switches used in radio frequency (RF) applications, such as GaAs field effect transistors, PIN diodes, etc., exhibit high insertion losses (e.g., 1-2 dB) and poor isolation in their off-states due to parasitic effects. MEMS switches, on the other hand, can replace conventional resonators, filters and semiconductor switches within many of these RF applications, such as satellite and wireless communications systems, commercial and military radar, global positioning systems and instrumentation systems. Compared to conventional semiconductor devices, MEMS switches have improved insertion losses (e.g., 0.1 dB up to 40 GHz) and very high isolation (e.g., >27 dB) when in their off-states, and typically consume negligible power during each switching cycle.

Signal switching within a MEMS device is accomplished by mechanical deflection of a suspended structure, such as a cantilever, which produces a metal-to-metal contact or, alternatively, capacitive coupling. While several actuation methods have been developed, such as electrostatic, electromagnetic, thermal and piezoelectric, the majority of MEMS switches are electrostatic. Unfortunately, electrostatic actuation is a non-linear mechanism that induces high acceleration levels at switch closure, resulting in heavy switch contact pounding. Further, electrostatic actuation requires high operating voltages at higher switch frequencies. For example, switching times below 5 μs typically requires greater than 50 V. Piezoelectric actuation offers many advantages over electrostatic, electromagnetic and thermal actuation methods, such as improved control, reliability, switching times, isolation, etc.

Here, piezoelectric actuation is based on the converse piezoelectric effect, in which a piezoelectric material produces a strain under the influence of an electric field. These materials mechanically expand and contract in response to an applied voltage, and, unlike traditional electrostatic MEMS switches, the closing force developed by a piezoelectric switch can be significantly improved by increasing the bias voltage (electric field strength) across the piezoelectric material. Additionally, the energy density available in ferroelectric thin films, such as PZT (lead zirconium titanate), is much greater than electrostatic materials, which advantageously increases the potential for conversion to mechanical work. However, MEMS piezoelectric switches incorporating ferroelectric thin films are difficult to produce, the residual stresses within the layers of the switch are difficult to control and the direction of switch flexure is often opposite to the desired effect.

SUMMARY OF THE INVENTION

Embodiments of the present invention provide a MEMS piezoelectric switch that has an articulated unimorph bridge attached to a substrate. The bridge includes a passive layer of zirconia and at least one silicon-based material, an active layer of a piezoelectric material that has a high piezoelectric coefficient, at least one pair of interdigitated electrodes, disposed on the top surface of the active layer and across which the bias voltage is applied, and a top contact electrode. A bottom contact electrode is provided on the substrate, and signals flow through the switch when the top and bottom contact electrodes contact one another. Both normally-open and normally-closed switch geometries are supported. Further embodiments of the present invention provide a method for fabricating a normally-closed MEMS piezoelectric switch.

BRIEF DESCRIPTION OF THE DRAWINGS

The above and other advantages of this invention will become more apparent by the following description of invention and the accompanying drawings.

FIG. 3b depicts a sectional view A-A' of a MEMS piezoelectric switch in an unactivated state, according to the embodiment of FIG. 3a.

FIG. 3c depicts a sectional view A-A' of a MEMS piezoelectric switch in an activated state, according to the embodiment of FIG. 3a.

DETAILED DESCRIPTION

Embodiments of the present invention are fabricated from a ferroelectric thin film, such as PZT, that has a high $d_{33}$ mode piezoelectric coefficient (e.g., 120 pC/N). Because perovskite ceramic thin films generate relatively small strains (e.g., approximately 0.1%), a rectangular, cantilevered bending structure may be provided to increase deflection. In an embodiment, the cantilevered structure is a unimorph that includes an active PZT layer on top of a passive stack of zirconia ($ZrO_2$) and silicon nitride ($Si_xN_y$), or, alternatively, silicon dioxide ($SiO_2$). A generally-rectangular, interdigitated (IDT) electrode configuration is formed on the top surface of the PZT layer, and includes a series of interlaced, opposing electrode "fingers," that, when activated, pole the PZT layer in the transverse direction and actuate the PZT layer's $d_{33}$ mode, causing the cantilevered structure to deflect downward, thereby closing the cantilevered switch. This switch geometry is known as "normally-open" or "NO."

Generally, the maximum deflection and blocking force are achieved by optimizing the thickness ratio of the active and passive layers of the unimorph. However, residual stresses in the deposited thin film layers may result in out-of-plane bending, which adversely affects switch performance. Compensation for these stresses may be accomplished by controlling the thickness of the PZT layer, which may adversely affect performance, or, alternatively, by controlling the stress in silicon nitride layer (if present). But, unless the stress compensation is precisely controlled, the deflection of the normally-open switch may be opposite to the desired direction, i.e., the deflection of the cantilevered structure may be upward instead of downward. Additionally, a cantilevered MEMS switch typically achieves switching speeds of about 1 to 2 μsec, which may be improved by clamping the cantilever at each end to form a clamped-clamped bridge structure. However, the deflection of a typical, rectangular clamped-clamped bridge is upward most of the time, which is opposite to the desired deflection direction for a normally-open switch.

Figure 1:
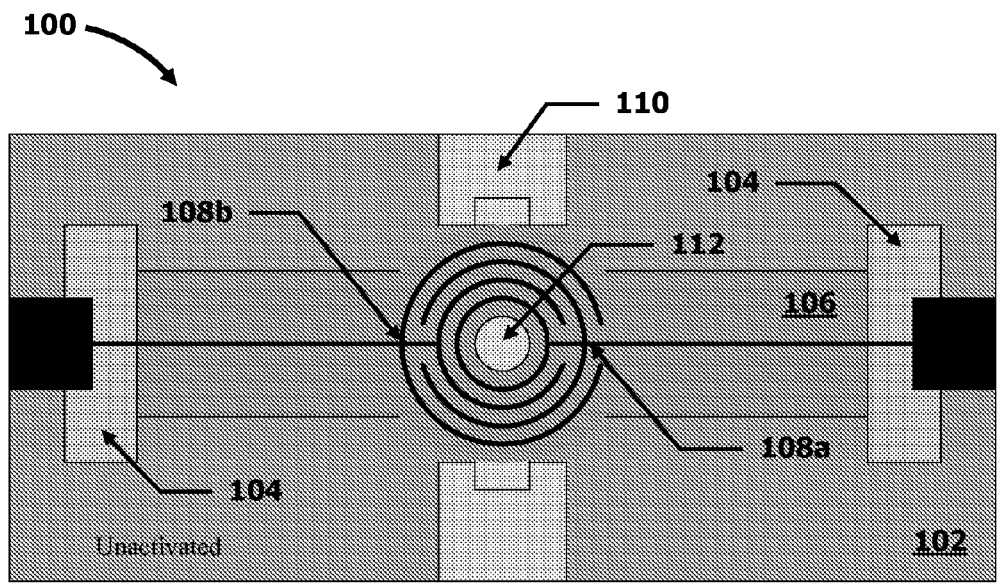
FIG. 1 depicts a top view of a MEMS piezoelectric switch in an unactivated state, according to an embodiment of the present invention.
Figure 2:
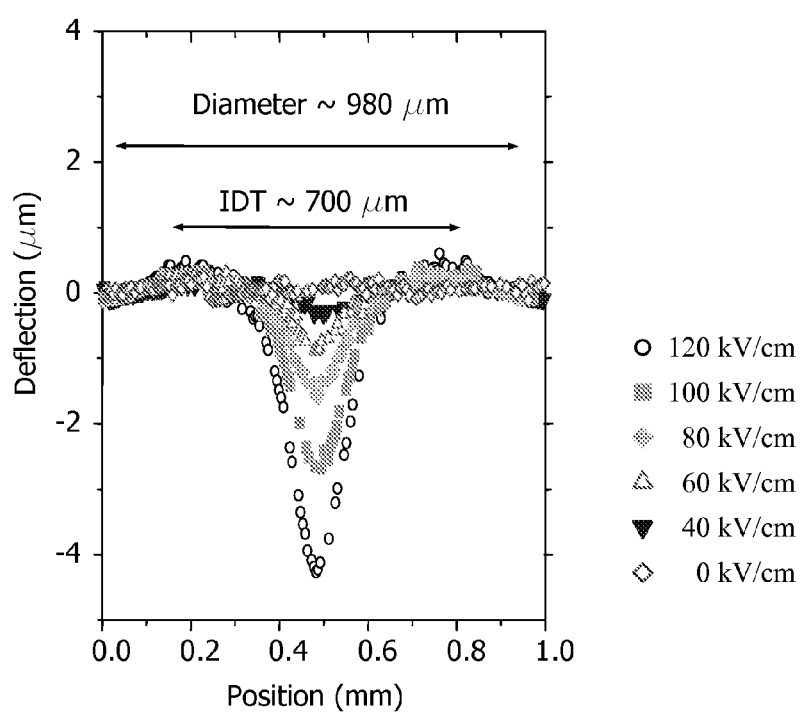
FIG. 2 is a graph of deflection profiles of a piezoelectric diaphragm as a function of different electric field strengths, according to an embodiment of the present invention.

To ensure a downward deflection in a normally-open MEMS piezoelectric switch, the generally-rectangular IDT electrode geometry is modified to form a "coin" in the center of the clamped-clamped bridge structure, as depicted in the embodiment of FIG. 1. This geometry advantageously leverages the deflection characteristics of a clamped piezoelectric diaphragm. For example, deflection vs. electric field strength for a 700 μm clamped piezoelectric diaphragm, with 10 μm electrode interdigitation, is presented in FIG. 2. In this example, the IDT electrodes are provided as interleaved "rings" on the surface of the diaphragm so that, when the diaphragm is activated by applying a bias voltage, the piezoelectric material deflects downward due to the combined piezoelectric response of the $d_{33}$ mode (radial expansion) and the $d_{31}$ mode (tangential contraction).

In the embodiment depicted in FIG. 1, MEMS piezoelectric switch 100 includes a substrate 102, such as, silicon (Si), aluminum oxide ($Al_2O_3$), etc., upon which a bottom contact electrode 110 is formed. Active layer 106 is formed on passive layer 104, and includes a top contact electrode 112 and generally-circular, interleaved IDT electrodes 108a,b. Each end of passive layer 104 is attached to substrate 302 (depicted as the visible portions of passive layer 104 in FIG. 1). Generally, passive layer 104 and active layer 106 form a bridge structure, clamped at each end, upon which top contact electrode 112 and IDT electrodes 108a,b are provided. Active layer 106 is PZT, while passive layer 104 is a layered combination, or stack, of zirconia and silicon nitride. Alternatively, silicon dioxide may be used in place of silicon nitride. Other, suitable silicon-based materials may be used, alone or in combination. Top contact electrode 112 and bottom contact electrode 110 may be gold (Au), Al, tungsten (W), etc., while IDT electrodes 108a,b may be Au, Al, platinum (Pt), etc.

In the unactivated state or position, a gap (not visible in FIG. 1) exists between the top and bottom contact electrodes 112, 110, as well as between the bottom surface of passive layer 104 and the top surface of substrate 102. When a bias voltage is applied to IDT electrodes 108a,b, active layer 106 causes the bridge to deflect in a downward direction so that top and bottom contact electrodes 112, 110 contact one another to allow signals of interest (RF or other frequencies) to flow through the switch. In this activated state or position, top and bottom contact electrodes 112, 110, of course, contact one another. In other embodiments, top and bottom electrodes 112, 110 may not contact one another in the activated state, and, instead, inductively couple the signal path portions. Passive layer 104 completely, or partially, contacts the substrate 102 in the activated state; alternatively, a small gap may remain. For switch dimensions on the order of 700×100×2 μm (length×width×height), and IDT electrode dimensions of 5 μm and separations of 5 μm, with a diaphragm diameter of at least 500 μm, bias voltages typically range from 5 V to 150 V, while switching speeds are on the order of 1 μsecs.

Figure 3A:
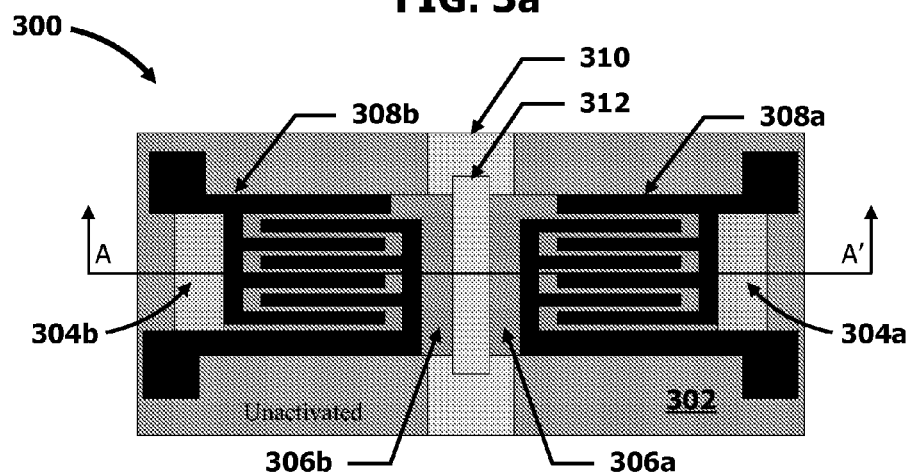
FIG. 3a depicts a top view of a MEMS piezoelectric switch in an unactivated state, according to another embodiment of the present invention.

For those switch applications that employ a "normally-closed," or "NC," switch geometry and for those NO switch applications that readily admit such adaptation, the clamped-clamped unimorph bridge may be advantageously incorporated into an NC switch, as depicted in FIGS. 3a,b,c. In this embodiment, MEMS piezoelectric switch 300 has a bending structure that is fixed, or clamped, on each end, i.e., a clamped-clamped bridge structure. FIG. 3a depicts a top view of MEMS piezoelectric switch 300 in an unactivated state, while FIGS. 3b,c depicts sectional views A-A' of MEMS piezoelectric switch 300 in unactivated and activated states, respectively.

MEMS piezoelectric switch 300 includes a substrate 302, such as, Si, $Al_2O_3$, etc., upon which a bottom contact electrode 310 is formed. Active layers 306a,b are formed on passive layers 304a,b and include generally-rectangular, interleaved IDT electrodes 308a,b, respectively. The respective end portions of passive layers 304a,b, are attached to substrate 302 (depicted as the visible portions of passive layers 304a,b in FIG. 3a, and readily apparent in FIGS. 3b,c). Top contact electrode 312 bisects the two sides (i.e., "a" and "b") of the bridge structure. Generally, passive layers 304a,b and active layers 306a,b form a bridge structure, clamped at each end, upon which top contact electrode 312 and IDT electrodes 308a,b are provided. Active layers 306a,b are PZT, while passive layers 304a,b are a layered combination, or stack, of zirconia and silicon nitride. Alternatively, silicon dioxide may be used in place of silicon nitride. Top contact electrode 312 and bottom contact electrode 310 may be Au, Al, W, etc., while IDT electrodes 308a,b may be Au, Al, Pt, etc.

Figure 3B:
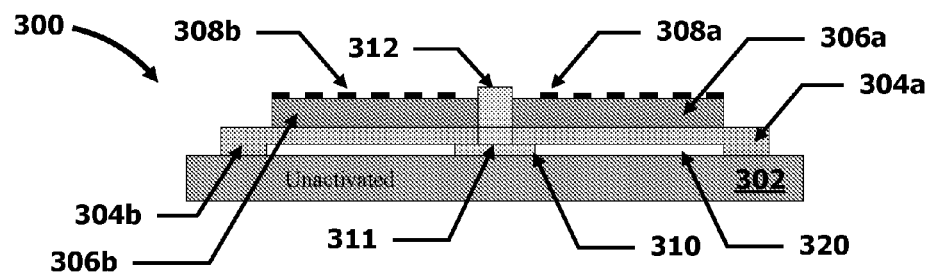
Figure 3C:
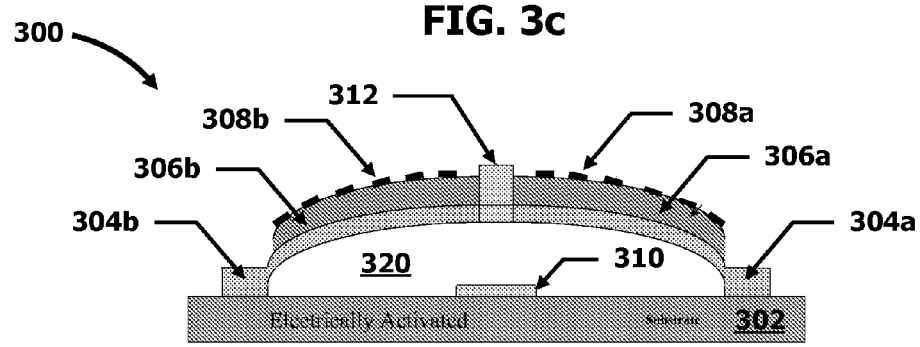

In the unactivated state or position, top and bottom contact electrodes 312, 310 contact one another at surface 311 to allow signals of interest (RF or other frequencies) to flow through the switch. In other embodiments, top and bottom electrodes 312, 310 may not contact one another in the activated state, and, instead, inductively couple the signal path portions. Passive layer 304a,b completely, or partially, contacts the substrate 302 in the unactivated state; alternatively, a small gap may remain, as depicted in FIG. 3b. When a bias voltage is applied to IDT electrodes 308a,b, active layer 306a,b causes the bridge to deflect in an upward direction so that top and bottom contact electrodes 312, 310 separate from one another to prevent signals of interest from flowing through the switch. In the activated state or position, gap 320 exists between the top and bottom contact electrodes 312, 310, as well as between the bottom surface of passive layer 304 and the top surface of substrate 302. For switch dimensions on the order of 700×100×2 μm (length×width×height), and IDT electrode widths of about 3 μm (i.e., the width of each electrode finger) and lengths of about 300 μm, and separations of about 6 μm (i.e., the distance between each opposing electrode finger), bias voltages typically range from 5 V to 150 V, while switching speeds are on the order of 1 μsecs.

FIGS. 4a to 4e graphically depict several process steps for fabricating a MEMS piezoelectric switch, according to an embodiment of the present invention. At FIG. 4a, sacrificial layer 422 and bottom contact electrode 410 are formed on the top surface of substrate 402. In one embodiment, amorphous silicon (a-Si) or low temperature polysilicon (poly-Si) is used for sacrificial layer 422. Alternatively, amorphous germanium (a-Ge) may be used. Next, at FIG. 4b, passive layer 404 is formed over the top surfaces of sacrificial layer 422 and bottom contact electrode 410, and extends over the ends portions of sacrificial layer 422 and onto substrate 402. Passive layer 404 includes a stack of zirconia and silicon nitride, silicon dioxide, etc. In various embodiments, the zirconia may be formed by a sol-gel process, mist deposition, atomic layer deposition, sputtering, etc., and the silicon nitride or silicon dioxide may be formed using plasma enhanced chemical vapor deposition, low temperature chemical vapor deposition, etc., or other stress controlled deposition techniques.

Figure 4A:
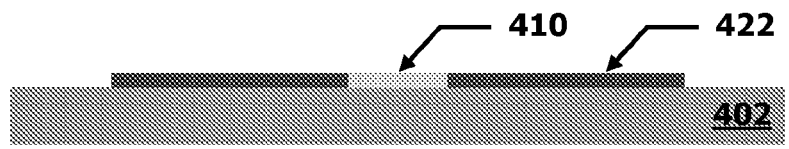
FIGS. 4a-4e graphically depict several steps in the production of a normally-closed, MEMS piezoelectric switch, according to an embodiment of the present invention.
Figure 4B:
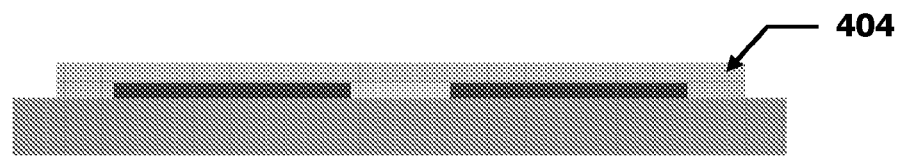
Figure 4C:
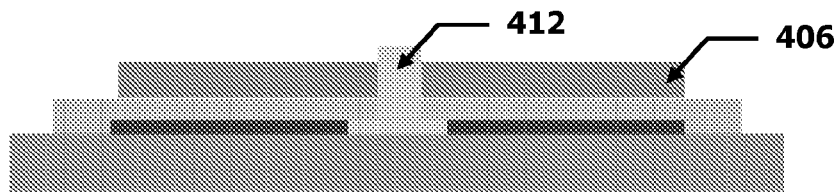
Figure 4D:
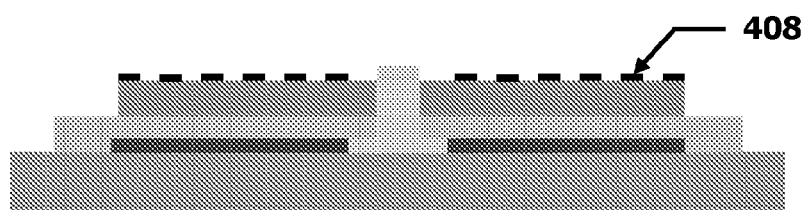
Figure 4E:
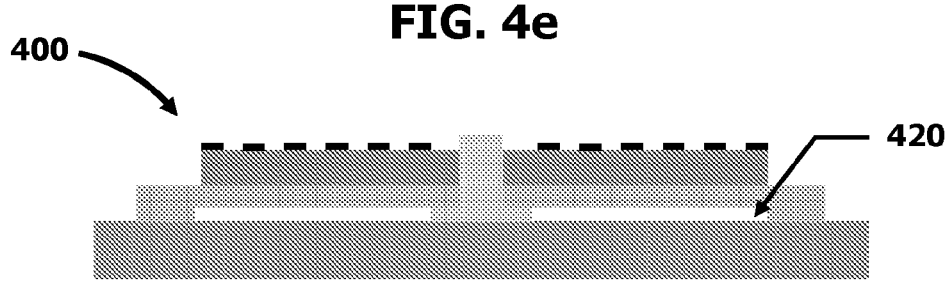

At FIG. 4c, active layer 406 is formed on the top surface of passive layer 404, for example, by the sol-gel process, mist deposition, sputtering, etc., approximately opposing sacrificial layer 422 located under the bottom surface of passive layer 404. Active layer 406 is a piezoelectric material having a high d33 mode piezoelectric coefficient, such as PZT. Top contact electrode 412 is then defined, for example, using thermal or e-beam evaporation, and extends through active layer 406 and passive layer 404 to abut bottom contact electrode 410. At FIG. 4*d*, interdigitated (IDT) electrodes 408 are then formed on the top surface of active layer 406, and, finally, at FIG. 4*e*, sacrificial layer 422 is removed to create gap 420, using, for example, a $XeF_2$ dry release process, a hydrogen peroxide ($H2O2$) vapor or liquid dry release process, etc. MEMS piezoelectric switch 400 has a normally-closed geometry, and includes a clamped-clamped bridge structure.

While this invention has been described in conjunction with specific embodiments thereof, many alternatives, modifications and variations will be apparent to those skilled in the art. Accordingly, the preferred embodiments of the invention as set forth herein, are intended to be illustrative, not limiting. Various changes may be made without departing from the true spirit and full scope of the invention as set forth herein.

We claim:

1. A microelectromechanical systems (MEMS) piezoelectric switch, comprising:
    a substrate having a bottom contact electrode disposed on an upper surface; and
    an articulated unimorph bridge, having first and second ends attached to the substrate, including:
        a passive layer including zirconia and at least one silicon-based material,
        an active layer, disposed on an upper surface of the passive layer, including a piezoelectric material having a high piezoelectric coefficient,
        at least one pair of interdigitated electrodes, disposed on an upper surface of the active layer, across which a bias voltage is applied, and
        a top contact electrode that contacts the bottom contact electrode when the bridge is in a first position, and that does not contact the bottom contact electrode when the bridge is in a second position;
    wherein the interdigitated electrodes form an interleaved, circular pattern surrounding the top contact electrode.

2. The MEMS piezoelectric switch of claim 1, wherein the piezoelectric material is PZT and the silicon-based material is silicon nitride or silicon dioxide.

3. The MEMS piezoelectric switch of claim 1, wherein the switch is a normally-open switch, the bridge moves to the first position when a positive bias voltage is applied to the interdigitated electrodes, and the bridge moves to the second position when a zero bias voltage is applied to the interdigitated electrodes.

4. The MEMS piezoelectric switch of claim 3, wherein the positive bias voltage is at least 5 V.

5. The MEMS piezoelectric switch of claim 1, wherein the width of each interdigitated electrode finger is about 5 μm and the separation between each opposing interdigitated electrode finger is about 5 μm.

6. The MEMS piezoelectric switch of claim 1, wherein the top contact electrode is surrounded by the active layer.

7. The MEMS piezoelectric switch of claim 1, wherein interdigitated electrodes are arranged concentrically about the top contact electrode.

* * * * *